United States Patent [19]

Clark et al.

[11] Patent Number: 4,490,901

[45] Date of Patent: Jan. 1, 1985

[54] ADJUSTMENT OF JOSEPHSON JUNCTIONS BY ION IMPLANTATION

[75] Inventors: Gregory J. Clark, Katonah; Robert E. Drake, Somers; Stanley I. Raider, Poughkeepsie, all of N.Y.

[73] Assignee: International Business Machines Corporation, Armonk, N.Y.

[21] Appl. No.: 491,944

[22] Filed: May 5, 1983

[51] Int. Cl.$^3$ .................... H01L 39/22; H01L 39/24; H01L 21/265

[52] U.S. Cl. .................... 29/574; 29/576 B; 29/578; 148/1.5; 357/5; 357/91; 427/63

[58] Field of Search .................... 29/574, 576 B, 578; 148/1.5; 427/63; 357/5, 91

[56] References Cited

U.S. PATENT DOCUMENTS

| | | | |
|---|---|---|---|
| 3,755,092 | 8/1973 | Antula | 204/35 N |
| 3,906,231 | 9/1975 | Fletcher | 250/338 |
| 4,093,503 | 6/1978 | Harris et al. | 427/63 |
| 4,176,365 | 11/1979 | Kroger | 357/5 |
| 4,299,679 | 11/1981 | Suzuki | 204/192 EC |

OTHER PUBLICATIONS

Wolf, P., IBM-TDB, 18, (1976), 2645.
Mohr, T. O., IBM-TDB, 20, (1978), 4944.
Harris et al., IBM-TDB, 20, (1977), 2437.
Cuomo et al., IBM-TDB, 25, (1982), 2092.
Broom et al., IBM J. Res. Develop. 24, (Mar. 1980), 206.
Superconducting Device Fabrication by Energetic Ion Damage by E. P. Harris et al., IBM Technical Disclosure Bulletin, vol. 17, No. 2, Jul. 1974, p. 604.
Superconducting Microcircuitry in Layered Compounds using Ion Implantation by E. P. Harris et al., IBM Technical Disclosure Bulletin vol. 17, No. 1, Jun. 1974, p. 257.
Applications of Ion Implantation to the Josephson Tunneling Technology by E. P. Harris, et al., IBM Technical Disclosure Bulletin, vol. 20, No. 6, Nov. 1977, p. 2435.
Annealing of Josephson Junction Devices by S. Basavaiah et al., IBM Technical Disclosure Bulletin vol. 17, No. 11, Apr. 1975, p. 3488.
Rugged Josephson Elements and Arrays by R. B. Laibowitz et al., IBM Technical Disclosure Bulletin, vol. 17, No. 3, Aug. 1974, p. 826.
Fabrication of Planar Josephson Junctions by Laser Irradiation by N. Braslau et al., IBM Technical Disclosure Bulletin, vol. 18, No. 11, Apr. 1976, p. 3845.

*Primary Examiner*—Upendra Roy
*Attorney, Agent, or Firm*—John J. Goodwin

[57] ABSTRACT

A method for trimming the zero voltage Josephson current of a tunnel junction including the steps of measuring the I-V characteristics of the completed junctions to quantify the change in $I_o$ necessary to meet the design requirements, placing the tested Josephson junctions on a metal block which is mounted in the sample chamber of an ion implanter structure which is pumped to $1.10^{-6}$ Torr. The junctions, kept at room temperature and oriented at a direction nearly normal to the ion beam, are implanted with magnetically analyzed ions of energies 50 keV to 2300 keV. Spatial uniformity of the ion implant beam is ±2% over a sample. Uniform spatial implantation over a large area sample is obtained by either sweeping of the beam across the sample, or restoring the sample through a stationary beam, determining the required ion dose to effect trimming from calibration curves, remeasuring the I-V characteristics after implantation to confirm that the required $I_o$ trim was effected, and then completing the fabrication of the Josephson device according to standard processing.

5 Claims, 10 Drawing Figures

ADJUSTMENT OF JOSEPHSON JUNCTIONS BY ION IMPLANTATION

BACKGROUND OF THE INVENTION

1. Field of the Invention

The present invention relates to the fabrication of Josephson tunnel junctions, and more particularly to a process for trimming Josephson current by ion implantation into the junction.

2. Description of the Prior Art The trimming of Josephson current parameters has been taught in the prior art by various techniques. Tailoring Josephson current density ($J_1$) by annealing is discussed in the publication "Annealing of Josephson Junction Devices" by S. Basavaiah et al, IBM Technical Disclosure Bulletin, Vol. 17, No. 11, April 1975, page 3488. In the publication "Rugged Josephson Elements and Arrays" by R. B. Laibowitz et al, IBM Technical Disclosure Bulletin, Vol. 17, No. 3, August 1974, page 826, the critical temperature ($T_c$) and current ($I_c$) are varied by annealing via heating through lasers or electron beams. Varying critical temperature $T_c$ by laser irradiation is also taught in the publication by N. Braslau et al, "Fabrication of Planar Josephson Junctions by Laser Irradiation", IBM Technical Disclosure Bulletin, Vol. 18, No. 11, April 1976, pages 3845, 3846.

The variation of critical temperature by ion bombardment damage is discussed in the E. P. Harris et al publication "Superconducting Device Fabrication by Energetic Ion Damage", IBM Technical Disclosure Bulletin, Vol. 17, No. 2, July 1974, page 604.

The use of ion implantation in Josephson circuits for other purposes are taught in the E. P. Harris et al publication, "Superconducting Microcircuitry for Layered Compounds Using Ion Implantation", IBM Technical Disclosure Bulletin, Vol. 17, No. 2, June 1974, pp. 257, 258 and the E. P. Harris et al publication "Applications of Ion Implantation to the Josephson Tunneling Technology", IBM Technical Disclosure Bulletin, Vol. 20, No. 6, November 1977, pages 2435, 2436.

U.S. Pat. No. 4,176,365 issued Nov. 27, 1979 to Kroger, entitled JOSEPHSON TUNNEL JUNCTION DEVICE WITH HYDROGENATED AMORPHOUS SILICON GERMANIUM OR SILICON-GERMANIUM ALLOY TUNNELING BARRIER describes Josephson tunnel device having an unusually high critical current density wherein dopants provide a further increase in the critical current density. The barrier is deposited by rf-sputtering in an atmosphere containing hydrogen.

U.S. Pat. No. 3,906,231 issued Sept. 16, 1975 to Fletcher et al entitled DOPED JOSEPHSON TUNNELING JUNCTION FOR USE IN A SENSITIVE IR DETECTOR describes a Josephson device with a modified tunnel barrier. The tunnel barrier located between a pair of electrodes includes a molecular species which is capable of coupling incident radiation of a spectrum characteristic of the molecular species into the tunnel barrier. The coupled radiation modulates the known Josephson characteristics of the superconducting device. As a result, a superconductive tunneling device can be tuned or made sensitive to a particular radiation associated with the dopant molecular species.

Ion implantation has been used in the prior art to modify other electrical properties of other type devices: T. W. Sigmon and R. Swanson, Solid State Electronics, 16, 1217 (1973) and P. D. Taylor and D. V. Morgan, Solid State Electronics, 19, 473, 481, 935 (1976).

However, the application of ion implantation for the purposes of directly trimming the zero voltage Josephson current in a completed tunnel junction is quite distinct from the teachings of such references.

Other references which relate to the general technical area of the present invention include the following:
IBM Technical Disclosure Bulletins:
  Vol. 17, No. 4, September 1974, page 1204,
  Vol. 17, No. 4, September 1974, page 1207,
  Vol. 17, No. 6, November 1974, page 1827.
U.S. Pat. Nos.
  3,755,092 by Antula on Aug. 28, 1973,
  4,299,679 by Suzuki on Nov. 10, 1981.

SUMMARY OF THE INVENTION

In the application of Josephson tunnel junctions in digital integrated circuits, the zero voltage Josephson current $I_o$ must be adjusted to within tight margins to meet design requirements.

An object of the present invention is to provide a method for adjusting or trimming the zero voltage Josephson current of a tunnel junction after fabrication of the tunnel junctions.

Another object of the present invention is to provide a method for trimming zero voltage Josephson current of a tunnel junction by decreasing the junction energy gap.

A further object of the present invention is to provide a method for trimming the zero voltage Josephson current of a tunnel junction by ion implantation.

Still another object of the present invention is to provide a method for trimming the zero voltage Josephson current of a tunnel junction by implanting boron or other ions.

A further object of the present invention is to provide a method for trimming the zero voltage Josephson current of a tunnel junction including the steps of measuring the I-V characteristics of the completed junctions to quantify the change in $I_o$ necessary to meet the design requirements, placing the tested Josephson junctions on a metal block which is mounted in the sample chamber of an ion implanter structure which is pumped to $1.10^{-6}$ Torr. The junctions, kept at room temperature and oriented at a direction nearly normal to the ion beam, are implanted with magnetically analyzed ions of energies 50 keV to 2300 keV. Spatial uniformity of the ion implant beam is $\pm 2\%$ over a sample. Uniform spatial implantation over a large area sample is obtained by either sweeping of the beam across the sample, or restoring the sample through a stationary beam, determining the required ion dose to effect trimming from calibration curves, remeasuring the I-V characteristics after implantation to confirm that the required $I_o$ trim was effected, and then completing the fabrication of the Josephson device according to standard processing.

The foregoing and other objects, features and advantages of the invention will be apparent from the following more particular description of the invention as illustrated in the accompanying drawings.

DESCRIPTION OF THE PREFERRED EMBODIMENT

Figure 1:
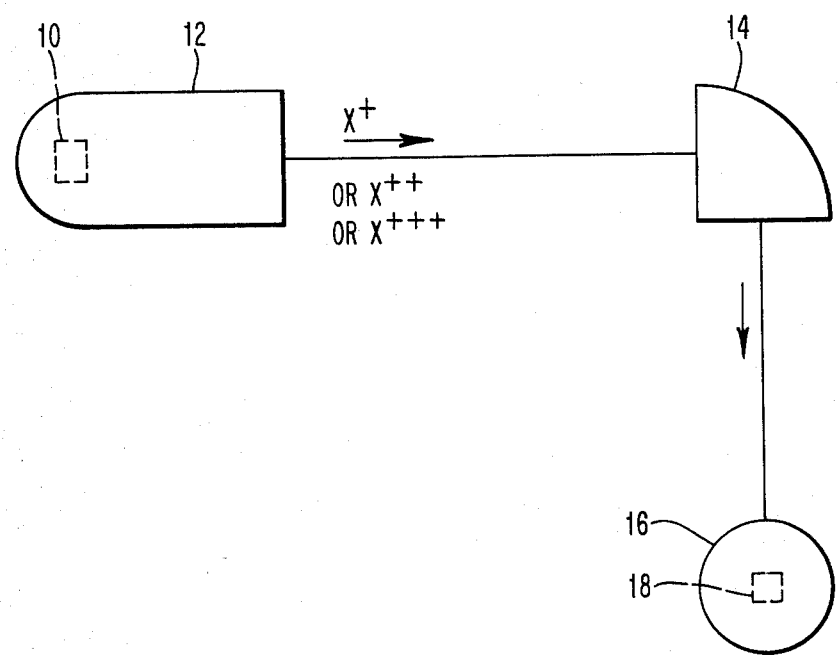
FIG. 1 is a schematic illustration of an ion implanter structure which can be used for implantation of Josephson tunnel junctions.
Figure 2:
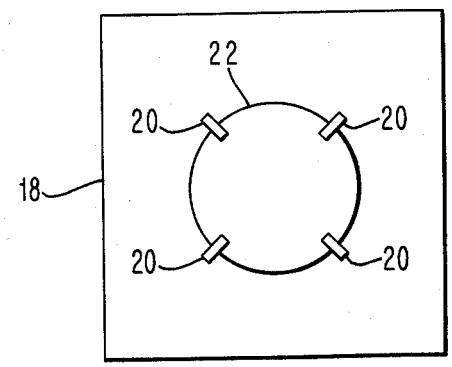
FIG. 2 is a diagrammatic view of how a sample can be mounted on a sample holder in the implant chamber of FIG. 1.
Figure 3:
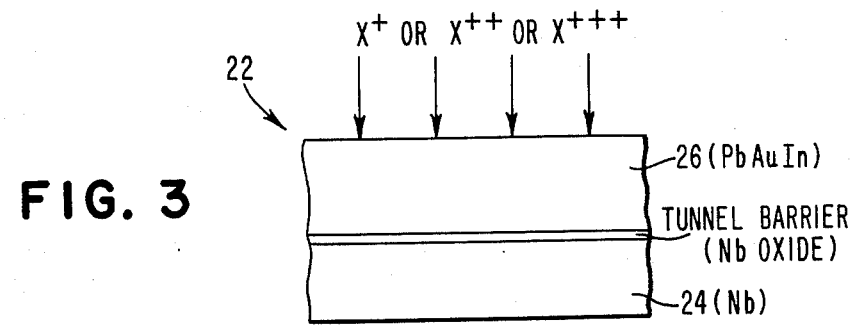
FIG. 3 is a schematic view of a Josephson tunnel junction that is being implanted through the counterelectrode according to the principles of the present invention.

The zero voltage Josephson current, $I_o$, in a tunnel junction is an important junction property that is dependent on the adjustable parameters such as the effective tunnel barrier thickness, the barrier heights, and the superconducting electrode energy gaps. Circuit designs require that $I_o$ be controlled within tight margins. The magnitude of $I_o$ is very sensitive to junction processing conditions and cannot be monitored sufficiently to satisfy these margins. Adjustments in $I_o$ are therefore best accomplished after the tunnel junctions are fabricated using a controllable trim procedure.

More particularly, the current density, $J_1$, in a Josephson tunnel junction is the Josephson current, $I_o$, normalized to the junction area, A, i.e., $J_1 = I_o/A$. In a Josephson tunnel junction, $J_1$ is linearly dependent on the superconducting energy gap voltage, $V_g$, and $J_1 \sim V_g \exp-(d \times \sqrt{\phi} \times m^*)$ is exponentially dependent on $-d \times \sqrt{(\phi \times m^*)}$, where d is the tunnel average barrier thickness, $\phi$ is the average barrier height, and $m^*$ is the effective mass of the tunneling electron. It is desirable to provide an $I_o$ trim procedure to alter one or more of these parameters in a reproducible, controllable manner without significantly affecting other device properties.

Attempts had previously been made in the prior art to trim $I_o$ by post-processing Josephson junctions either by thermal annealing or by electron beam irradiation. Junctions formed with Nb/Nb oxide/PbAuIn structures are more thermally stable than either Nb/Nb oxide/Nb or Pb alloy/oxide/Pb alloy junctions. Although annealing the Nb at 210° C. causes the junction current densities to change by about 20% after 1 hour and by 50% after 18 hours with little change in junction subgap conductance, the low melting point Pb-alloy counterelectrode makes this an unattractive $I_o$ trim procedure. E-beam irradiation of Nb/oxide/Nb and Pb-alloy/oxide/Pb-alloy junctions cause current densities to increase 20 to 30% but irradiation of Nb/oxide/Pb-alloy junctions do not change more than 2 to 3% at e-beam currents of 0.1 mA and voltages to 30 keV. Addition of an active element, such as In, to the counterelectrode metallurgy as described by S. S. Pei, T. A. Fulton, L. N. Dunkleberger and R. A. Keene, IEEE Trans. Magn., MAG-19 (1983) was used to alter $I_o$ but this approach is not applicable to structures which already contain In in the counterelectrode.

In Josephson devices, there is a sensitive dependence of the electrical properties of tunnel junctions on the junction chemistry and structure, and ion implantation may adversely change the junction properties. Thus, the method of the present invention takes into account that significantly greater processing control is required to fabricate Josephson tunnel junctions and the electrical properties of Josephson tunnel junctions are very sensitive to the tunnel barrier and the superconductor/tunnel barrier interface. The method of the present invention also recognizes that ion implantation into tunnel junctions can alter several of the junction parameters that affect $I_o$, either by structural modifications, by impurity doping, or by implantation damage. In one embodiment of the method, boron ion implantation into completed Nb/Nb oxide/PbAuIn Josephson devices is described.

In the present invention, a method is provided wherein ions, and more particularly, boron ions, are introduced into the tunnel junction to trim or adjust the zero voltage Josephson current. The method takes into account the fact boron ions (B) are implanted into completed planar and edge Nb/Nb oxide/PbAuIn Josephson tunnel junctions to directly trim the Josephson pair current, $I_o$. The implantation causes an increase in $I_o$ and in the junction subgap conductance and a decrease in the junction energy gap. For a fixed junction fabrication procedure, the variations in $I_o$ are monotonic with B implant dose. Optimum trimming occurs when the B ions are implanted such that the peak in the depth distribution occurs at, or just beneath, the tunnel barrier. The variations in $I_o$ are also monotonic with boron implant dosage for a fixed junction fabrication procedure. The changes in junction electrical properties are thought to be caused by ion implantation primarily due to modifications of the Nb/Nb oxide interfacial regions.

Thus, ion implantation provides a reproducible $I_o$ trim procedure for Josephson device integrated circuits. The process is described more specifically hereinbelow. First, a Josephson tunnel junction is fabricated, using known techniques, such as described in the publication by S. I. Raider and R. E. Drake, IEEE Trans. Magn., MAG-17, 299 (1981).

In the junction, the deposited Nb films are about 2000 Å thick and the oxide barrier formed by rf plasma oxidation of the Nb surface, is about 20 Å thick. A PbAu(4 wt. %)In(12 wt. %) counterelectrode, 3500 Å to 5000 Å thick, was deposited over the oxide tunnel barrier. A 25 Å $NbO_xC_y$ transition region separates the Nb base electrode from the $Nb_2O_5$ tunnel barrier. The planar junctions were defined by SiO windows with areas typically $6.6 \times 10^{-6}$ cm$^2$. Edge junction areas ($7.1 \times 10^{-8}$ cm$^2$) were defined by SiO windows and were formed on the side of an anodized Nb line. The edge junctions were inclined at about 45° angles from the oxidized Si substrate (2.54 cm diameter) surface. Implanted junctions were located within a 0.645 cm$^2$ area Some edge junctions are positioned orthogonally to others. The method of the invention is applicable with both edge and planar junctions.

Figure 4:
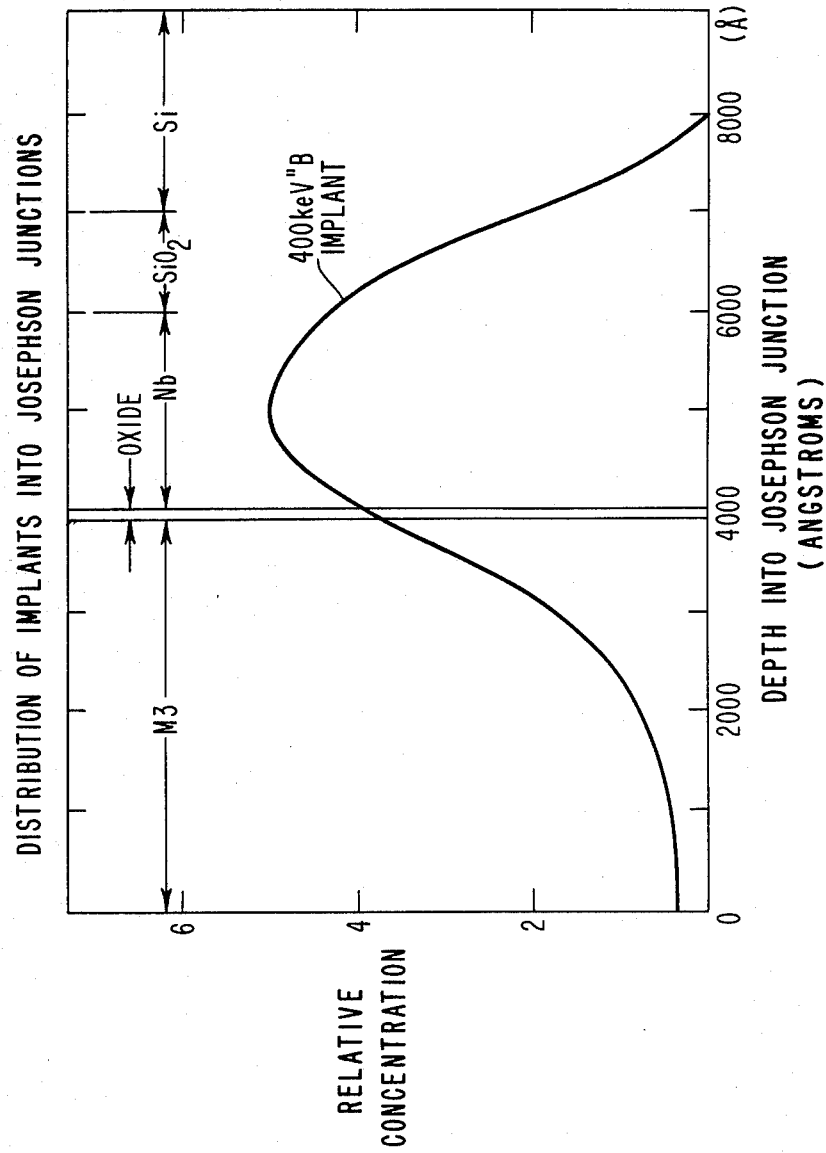
FIG. 4 is a curve illustrating the depth distribution for a 400 keV B implantation into a Nb/Nb oxide/PbAuIn Josephson tunnel junction.

In accordance with the process steps of the present invention, the junctions are implanted with magnetically analyzed B ions of energies from 50 keV to 2300 keV. The wafers are mounted in a chamber that was pumped to a pressure of $10^{-6}$ Torr. Ion implant doses and dose rates are monitored by direct current integration from the wafer. Implants are made at room temperature. The B beam is located incident at 7° to the wafer normal. Ion beam irradiations are spatially uniform to ±2% over an area of >6.5 cm². The dose rates are typically 200 nA and the integrated B doses are in the $10^{13}$/cm² to $10^{15}$/cm² range. A typical depth distribution for a 400 keV B implantation into a Josephson junction is shown in FIG. 4. It can be seen that the FWHM depth distribution is about 2000 Å.

Figure 5:
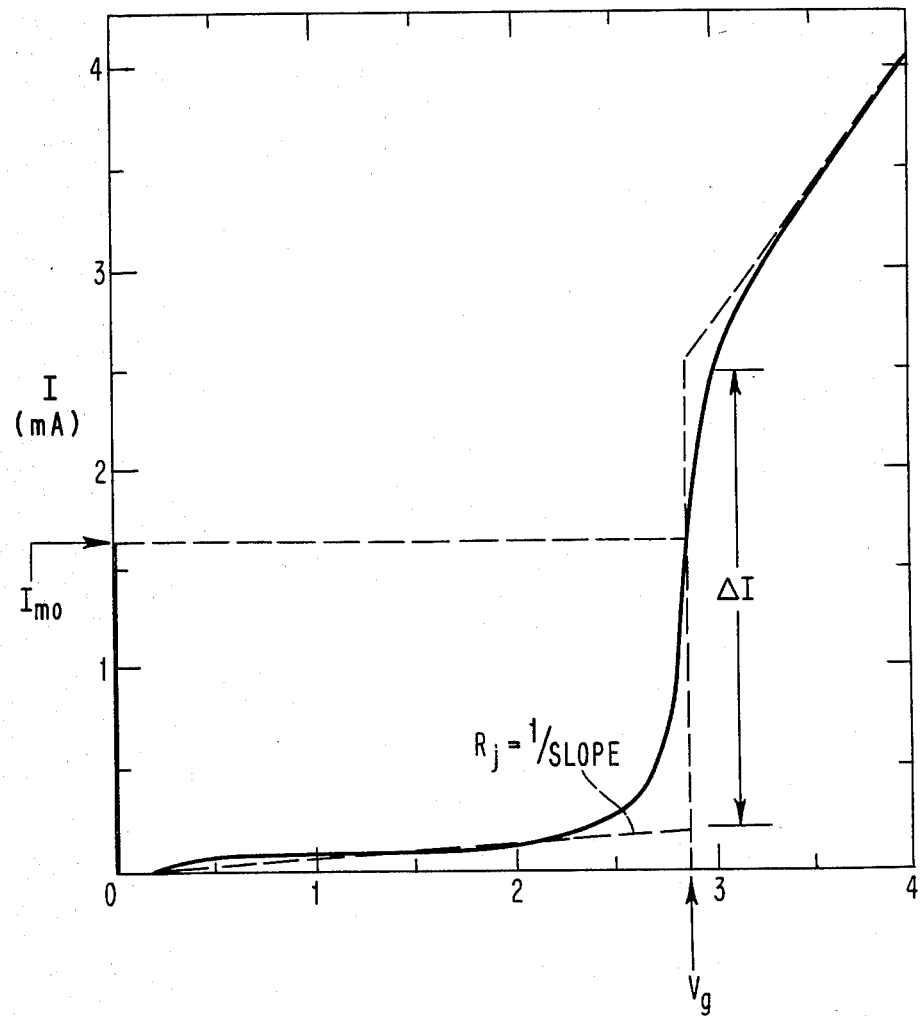
FIG. 5 is a curve illustrating the I-V characteristics of typical Nb/Nb oxide/PbAuIn Josephson tunnel junction.

Changes in the junction properties due to ion implantation are determined from the junction current-voltage (I–V) characteristics which are measured before and after implantation. A typical I–V junction characteristic is shown in FIG. 5. The current density, $J_1$, the gap voltage, $V_g$, and the subgap conductance are each measured. The design parameter, $V_m$, which is exponentially dependent on $V_g/T$ where T is the absolute temperature, is inversely proportional to the subgap conductance. $V_m$ is defined as $I_o \times R_j$, where $R_j$ is the subgap resistance. $R_j$ is empirically defined as a linear resistor which crosses the I–V curve at V=1.7 mV.

Figure 6:
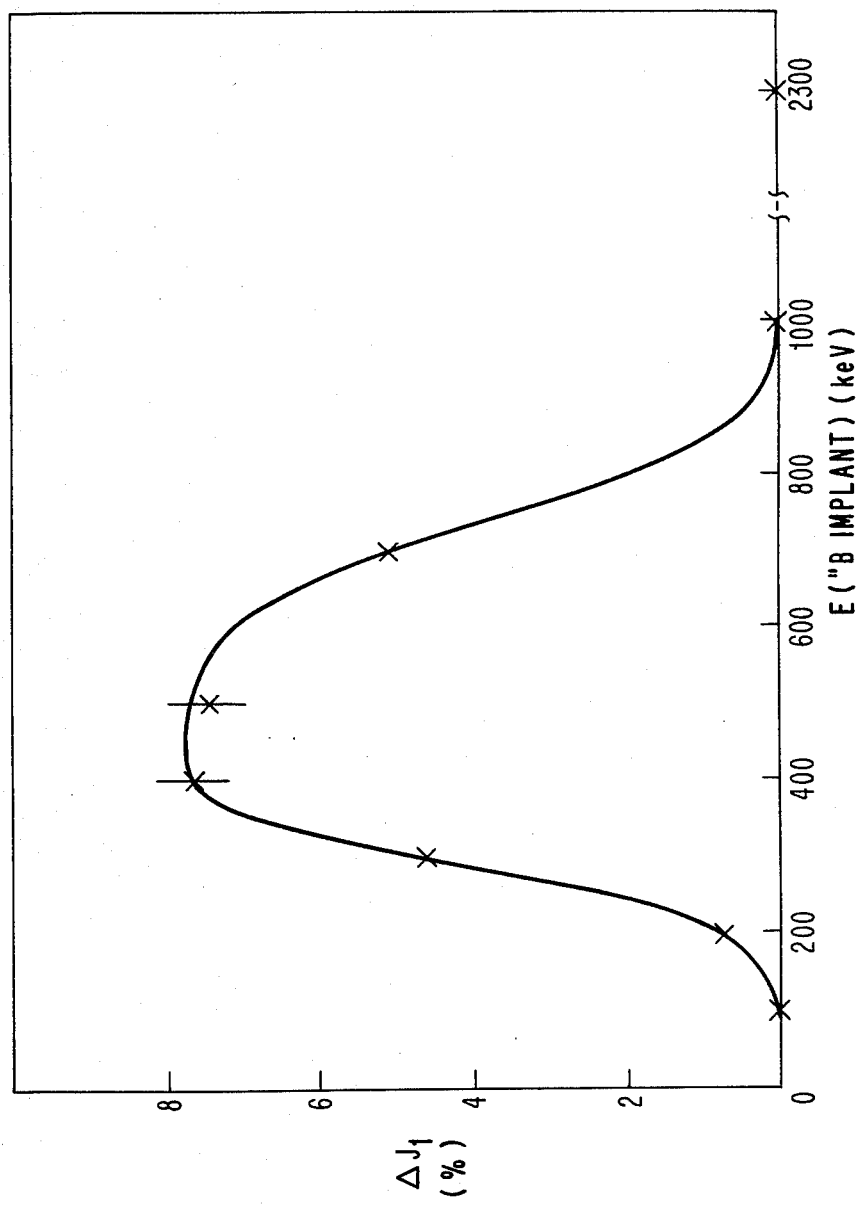
FIG. 6 is a curve illustrating the depth distribution of B in tunnel junctions and their effect on $\Delta J_1$.

Only those B ions implanted and stopped in the Nb/Nb oxide structure are believed to affect the junction properties. This is illustrated in FIG. 6 in which the change in current density, $\Delta J_1$, is plotted against the implant energy. When the ions are stopped in the PbInAu alloy or when they go through the junction and are stopped in the substrate, no change in the I–V characteristics of the junction occur. The maximum change in the I–V characteristics for a given dose occurs when the B range distribution was centered at, or just below, the Nb oxide tunnel barrier. When the B range distribution is shifted deeper into the Nb electrode or into the substrate, the changes in $J_1$ and $V_m$ decrease but the relative change between $J_1$ and $V_m$ are independent of the location of the implant distributions.

Figure 7:
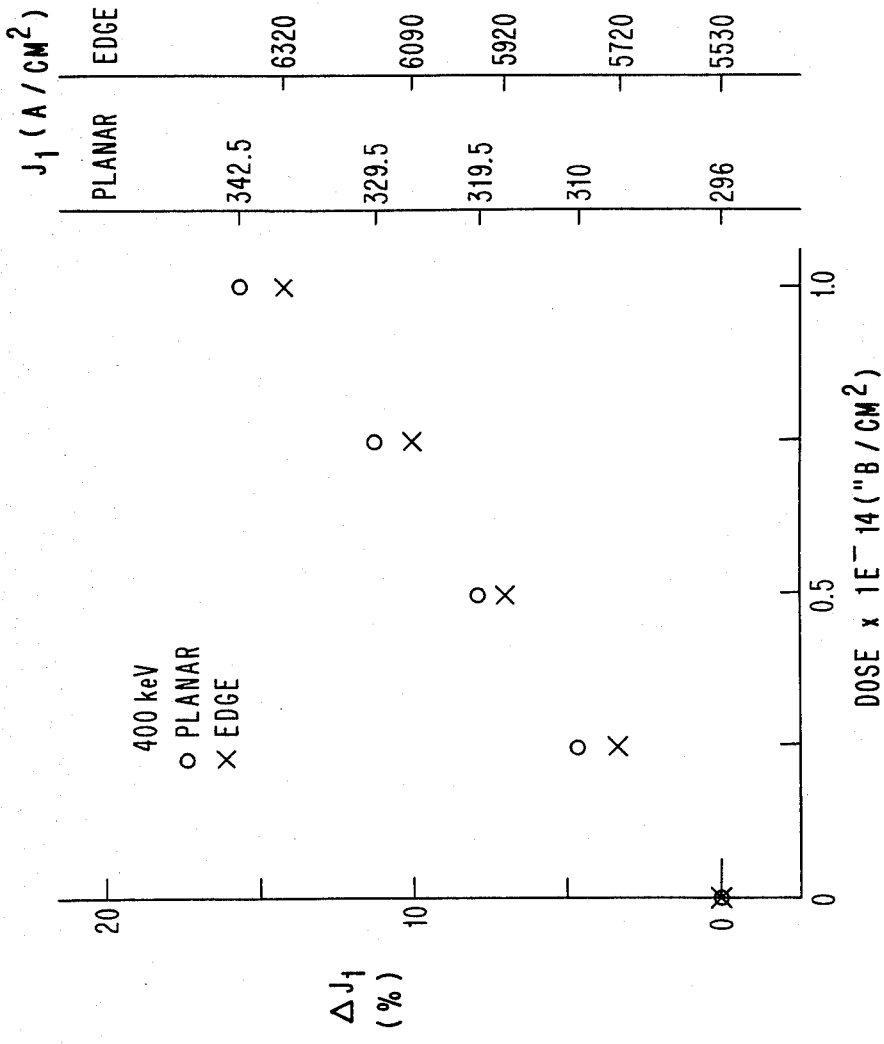
FIG. 7 is an illustration of the $J_1$ dependence on the 400 keV B dose for edge and planar tunnel junctions.

In FIG. 6, the change in the current density, $\Delta J_1$, following 400 keV B implants, is plotted as a function of the B dose for both edge and planar junctions. The changes were obtained using a number of planar and edge junctions in the measurements. It is noted that the $\Delta J_1$ was monotonically increased with B dose and exhibits only a small dependence on whether the junction was edge or planar despite the differences in initial $J_1$, in subgap conductance, in $V_g$, in junction area or in junction inclination. The change in the edge and in the planar junction current densities were 6.4% and 6.2%, respectively, for an implant of $2.5 \times 10^{13}$ B/cm². A change in $I_o$ due to B ion implantation would be unaffected by small variations in junction inclination. After the total implant of $10^{14}$ B/cm², $I_o$ increased by about 15%, a change that is in a range of practical interest for trimming. The standard deviation in $I_o$ for edge junctions increased only by 2% after the total B implantation. Edge junctions facing orthogonal to each other did not differ in the $I_o$ change due to implantation. Implantation of a total of $4.5 \times 10^{14}$ B ions caused $J_1$ to change by +87% as shown in FIG. 7.

Figure 8:
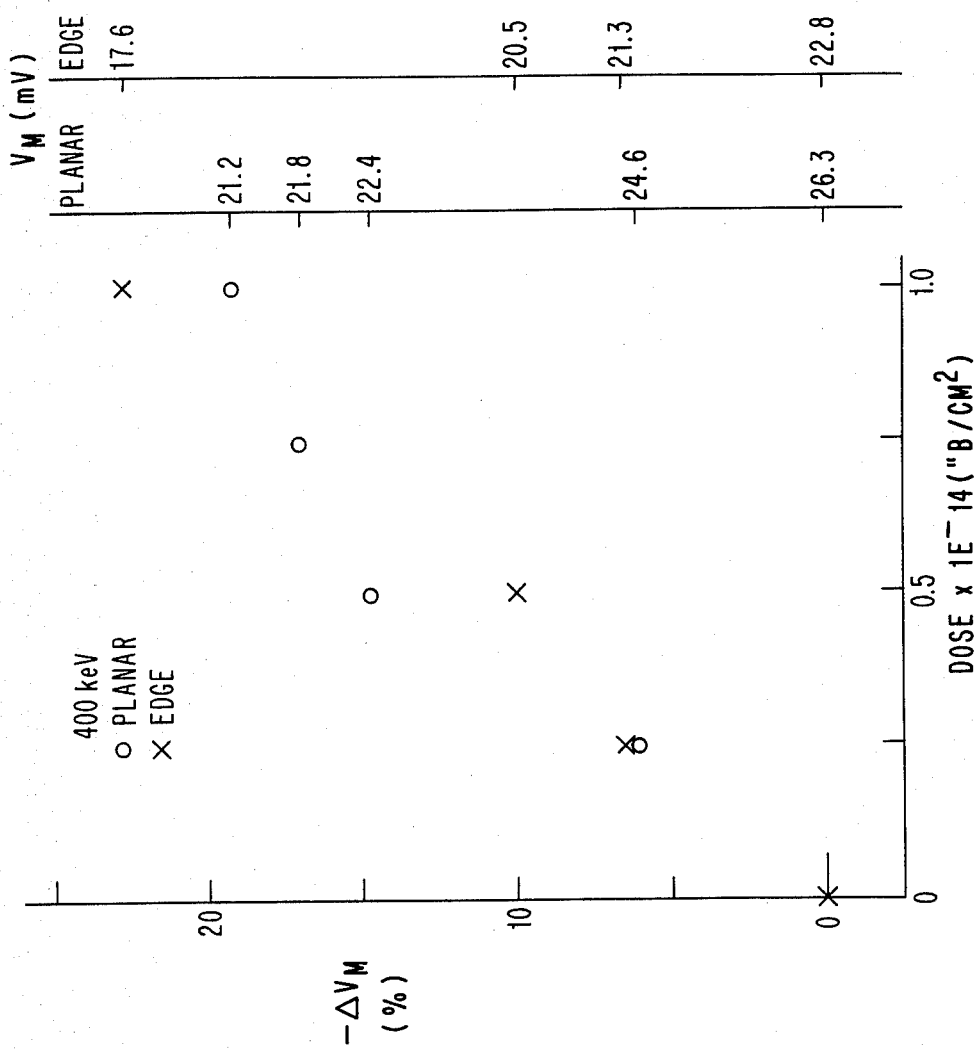
FIG. 8 shows the $V_m$ dependence on 400 keV B dose for edge and planar tunnel junctions.
Figure 9:
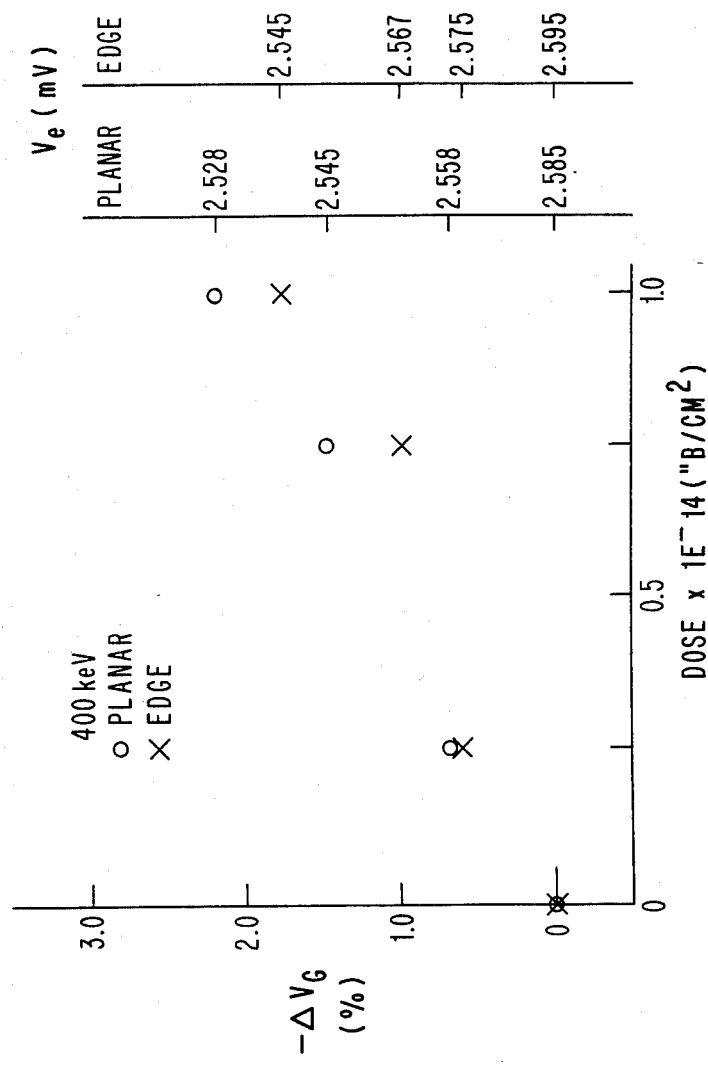
FIG. 9 shows the $V_g$ dependence on 400 keV B dose for edge and planar tunnel junctions.

The increase in subgap conductance with B dose is shown in FIG. 8 in terms of $V_m$. The corresponding decrease in $V_g$ with B dose is shown in FIG. 9.

The subgap conductance, and therefore $V_m$, is due to the thermal excitation of quasiparticles across the superconducting energy gap in an ideal (BCS) junction. The observed $\Delta V_m$ can largely be accounted for by the corresponding $\Delta V_g$. Measurement of the difference gap and the sum gap indicate that the $\Delta V_g$ is mostly due to changes in the superconducting properties of the Nb electrode.

Figure 10:
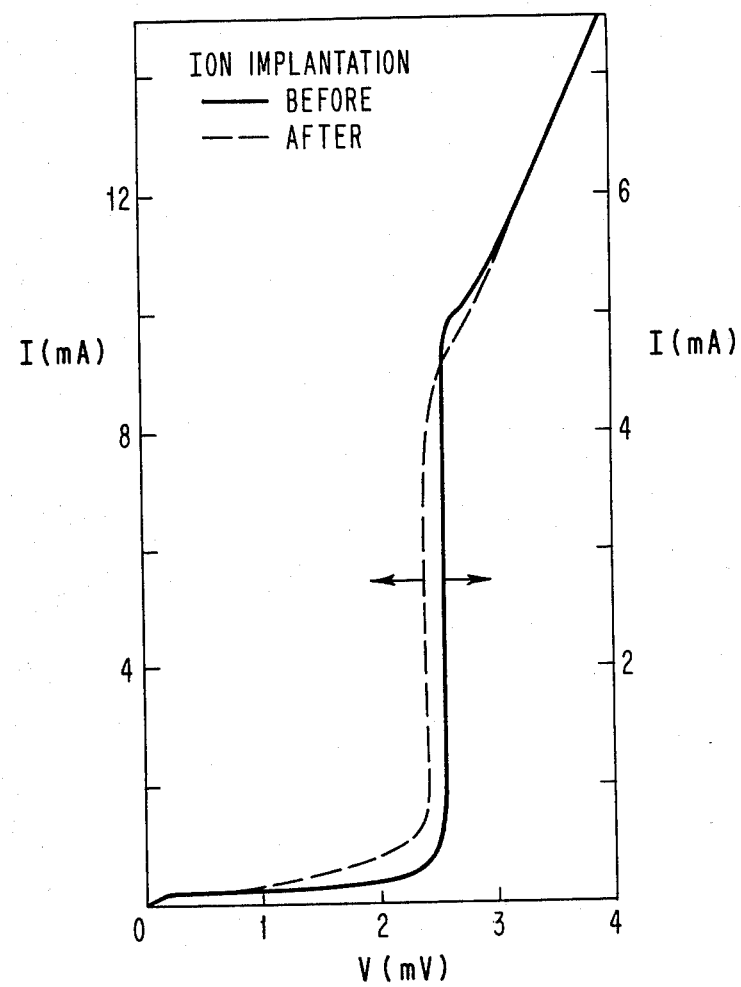
FIG. 10 shows the curve of the junction I-V characteristics before (—) and after (--) $5 \times 10^{14}/cm^2$ nitrogen implantation.

It has been established that the modification of the junction electrical properties by B ion implantation are independent of the source of the Nb base electrode and of the PbAuIn counterelectrode. The changes in the I–V characteristics illustrated in FIG. 10, indicate that the oxide barrier is not becoming more conductive with ion implantation as might be expected from oxide damage or oxide doping. Doping of the tunnel barrier, which is about $10^{18}$/cm³ for a B implant of $10^{14}$/cm², is dependent on the depth distribution and the dose and is not strongly dependent on the detailed plasma processing to form the tunnel barrier. A comparison of edge and planar junctions indicates that ion-induced changes are independent of the initial $J_1$ and the tunnel barrier thickness. Thus, the doping of the oxide tunnel barrier is not the mechanism producing the junction electrical changes, the changes in junction electrical properties caused by ion implantation are believed to be due to modifications of the Nb/Nb oxide interfacial regions.

What has been described is an effective method using ion implantation to directly trim $I_o$ in completed Josephson tunnel junctions. This trimming technique can be accomplished with minimal changes in junction processing and is the only direct $I_o$ trim presently available. Boron ions are used to obtain the optimum $I_o$ trim in that they produce the maximized change in $J_1$ for a minimal change in $V_m$. The method of the present invention is effective because changes in $I_o$ are predictable, the changes are reproducible for a fixed junction process, and the modified junction properties are stable after thermal annealing.

Having thus described our invention, what we claim as new, and desire to secure by Letters Patent is:

1. A method for adjusting the zero voltage Josephson current ($I_o$) of a tunnel junction by implanting ion including the steps of
   providing first and second superconductive electrodes with a tunnel junction located between said first and second electrodes whereby tunneling current can flow therethrough between said superconductive electrodes,
   measuring the voltage-current characteristics of said tunnel junction,
   disposing said electrodes with said tunnel junction in an ion implantation structure, including an ion implantation beam, and implanting a boron ion species into said tunnel junction for trimming said zero voltage Josephson current $I_o$ by decreasing the junction energy gap.

2. A method according to claim 1 wherein said ion species is magnetically analyzed $^{11}$B boron ions.

3. A method according to claim 1 wherein said junctions are implanted with a beam of magnetically analyzed $^{11}$B ions of energies in the range from 50 keV to 2300 keV at a direction substantially normal to said junctions.

4. A method according to claim 1 wherein said first superconductive electrode is composed of niobium, said second superconductive electrode is composed of lead, gold and indium, and said tunnel junction is composed of niobium oxide.

5. A method according to claim 4 wherein said ion species is magnetically ionized $^{11}$B species with energies in the range of 50 keV to 2300 keV which are implanted with doses in the range from $10^{13}$/cm² to $10^{15}$/cm².

* * * * *